(12) United States Patent
Srinivas et al.

(10) Patent No.: US 9,871,012 B2
(45) Date of Patent: Jan. 16, 2018

(54) METHOD AND APPARATUS FOR ROUTING DIE SIGNALS USING EXTERNAL INTERCONNECTS

(71) Applicant: QUALCOMM Incorporated, San Diego, CA (US)

(72) Inventors: Vaishnav Srinivas, San Diego, CA (US); Bernie Jord Yang, San Diego, CA (US); Michael Brunolli, Escondido, CA (US); David Ian West, San Diego, CA (US); Charles David Paynter, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/802,759

(22) Filed: Mar. 14, 2013

(65) Prior Publication Data

US 2014/0061642 A1    Mar. 6, 2014

Related U.S. Application Data

(60) Provisional application No. 61/696,092, filed on Aug. 31, 2012.

(51) Int. Cl.
*H01L 23/00* (2006.01)
*H01L 21/66* (2006.01)
*H01L 21/56* (2006.01)

(52) U.S. Cl.
CPC .............. *H01L 24/17* (2013.01); *H01L 22/32* (2013.01); *H01L 24/05* (2013.01); *H01L 24/14* (2013.01);

(Continued)

(58) Field of Classification Search
CPC ... H01L 23/522; H01L 23/5221; H01L 24/17; H01L 24/29; H01L 24/34; H01L 24/14; H01L 24/81; H01L 22/32; H01L 24/05

(Continued)

(56) References Cited

U.S. PATENT DOCUMENTS 5,384,486 A * 1/1995 Konno .......................... 257/752
5,898,223 A * 4/1999 Frye et al. .................... 257/777

(Continued)

FOREIGN PATENT DOCUMENTS

| DE | 1937009 A1 | 1/1971 |
| EP | 0467553 A1 | 1/1992 |

(Continued)

OTHER PUBLICATIONS

Rao et al. (Design and Development of Fine Pitch Copper/Low-K Wafer Level Package. IEEE Transactions on Advanced Packaging, vol. 33, No. 2, May 2010 hereinafter "Rao").*

(Continued)

*Primary Examiner* — Benjamin Sandvik
*Assistant Examiner* — Farid Khan
(74) *Attorney, Agent, or Firm* — W&T/Qualcomm

(57) ABSTRACT

Various aspects of an approach for routing die signals in an interior portion of a die using external interconnects are described herein. The approach provides for contacts coupled to circuits in the interior portion of the die, where the contacts are exposed to an exterior portion of the die. The external interconnects are configured to couple these contacts so that signals from the circuits in the interior portion of the die may be routed externally to the die. In various aspects of the disclosed approach, the external interconnects are protected by a packaging for the die.

31 Claims, 7 Drawing Sheets

(52) U.S. Cl.
CPC .............. *H01L 24/29* (2013.01); *H01L 24/81* (2013.01); *H01L 21/563* (2013.01); *H01L 24/11* (2013.01); *H01L 24/13* (2013.01); *H01L 24/16* (2013.01); *H01L 24/27* (2013.01); *H01L 24/30* (2013.01); *H01L 24/32* (2013.01); *H01L 24/83* (2013.01); *H01L 2224/02377* (2013.01); *H01L 2224/0401* (2013.01); *H01L 2224/0556* (2013.01); *H01L 2224/05558* (2013.01); *H01L 2224/05569* (2013.01); *H01L 2224/11462* (2013.01); *H01L 2224/131* (2013.01); *H01L 2224/13028* (2013.01); *H01L 2224/13109* (2013.01); *H01L 2224/13116* (2013.01); *H01L 2224/13147* (2013.01); *H01L 2224/14165* (2013.01); *H01L 2224/16225* (2013.01); *H01L 2224/16245* (2013.01); *H01L 2224/27462* (2013.01); *H01L 2224/29028* (2013.01); *H01L 2224/29078* (2013.01); *H01L 2224/29147* (2013.01); *H01L 2224/3012* (2013.01); *H01L 2224/3213* (2013.01); *H01L 2224/73204* (2013.01); *H01L 2224/81193* (2013.01); *H01L 2224/81815* (2013.01); *H01L 2224/831* (2013.01); *H01L 2924/00014* (2013.01); *H01L 2924/01322* (2013.01); *H01L 2924/07802* (2013.01); *H01L 2924/381* (2013.01)

(58) Field of Classification Search
USPC .......................... 438/106; 257/48, 737, 786
See application file for complete search history.

(56) References Cited

U.S. PATENT DOCUMENTS

| | | | |
|---|---|---|---|
| 6,397,361 B1 | 5/2002 | Saitoh | |
| 6,498,396 B1 | 12/2002 | Arimoto | |
| 6,534,847 B2 | 3/2003 | Hikita et al. | |
| 7,569,935 B1 | 8/2009 | Fan | |
| 7,868,454 B2 | 1/2011 | Lin | |
| 8,278,141 B2 | 10/2012 | Chow et al. | |
| 8,299,594 B2 | 10/2012 | Michaels et al. | |
| 2001/0005146 A1 | 6/2001 | Takekuma et al. | |
| 2004/0089951 A1 | 5/2004 | Lin | |
| 2007/0102714 A1 | 5/2007 | Lee et al. | |
| 2007/0102814 A1* | 5/2007 | Baek | H01L 23/5258 257/734 |
| 2008/0150586 A1 | 6/2008 | Kitada et al. | |
| 2009/0244874 A1* | 10/2009 | Mahajan et al. | 361/809 |
| 2010/0276787 A1 | 11/2010 | Yu et al. | |
| 2012/0126368 A1 | 5/2012 | Chan et al. | |
| 2014/0035093 A1* | 2/2014 | Pincu | H01L 25/0657 257/506 |

FOREIGN PATENT DOCUMENTS

| | | |
|---|---|---|
| EP | 0908952 A2 | 4/1999 |
| JP | H09107048 A | 4/1997 |
| JP | H11195746 A | 7/1999 |
| JP | 2002170928 A | 6/2002 |
| JP | 2005150391 A | 6/2005 |
| JP | 2007335888 A | 12/2007 |
| WO | WO-2007027994 A2 | 3/2007 |
| WO | WO-2009045371 A2 | 4/2009 |

OTHER PUBLICATIONS

International Search Report and Written Opinion—PCT/US2013/057613—ISA/EPO—dated Feb. 21, 2014.
Rao V.S., et al., "Design and Development of Fine Pitch Copper/Low-K Wafer Level Package", 10th Electronics Packaging Technology Conference, 2008 (EPTC 2008), IEEE, Piscataway, NJ, USA, Dec. 9, 2008 (Dec. 9, 2008), pp. 850-859, XP031413908, ISBN: 978-1-4244-2117-6.

* cited by examiner

METHOD AND APPARATUS FOR ROUTING DIE SIGNALS USING EXTERNAL INTERCONNECTS

CROSS-REFERENCE TO RELATED APPLICATIONS

This application claims priority to and the benefit of provisional patent application No. 61/696,092, titled "METHOD AND APPARATUS FOR ROUTING DIE SIGNALS USING EXTERNAL INTERCONNECTS" and filed in the United States Patent and Trademark Office on Aug. 31, 2012, the entire contents of which are incorporated herein by reference.

BACKGROUND

Field

Aspects of the present disclosure relate generally to integrated circuits, and more particularly, to a method and apparatus for routing die signals using external interconnects.

Background

Effective routing of various signals in modern integrated circuits involves overcoming many challenges, including ensuring proper timing of signal distribution, minimizing cross-talk, and matching impedances, all while complying with ever-shrinking available real estate due to higher component counts. The routing of clock signals is especially critical as these signals are used to synchronize different data signals arriving from different parts of the integrated circuit. However, due to impedances present in interconnects, there are often mismatches in clock signal arrival times at various locations of the integrated circuit because of varying spatial distances between a clock source and locations of circuits coupled to the clock source. These mismatches in timing are known as clock skews. Also, due to noise caused by other interconnect lines, such as those running in parallel with the clock signal lines, clock signals arriving at two different locations with the same clock input may also experience a phase noise, commonly known as clock jitter.

A clock distribution network (CDNs) may be used in an attempt to ensure constraints regarding clock skew and jitter are minimized. Other considerations such as fast transition times and a balanced duty cycle also need to be taken into account. CDNs may be designed using such different techniques as H-trees, buffered clock trees, balanced clock trees, and meshed clock networks. However, because interconnects do not scale proportionally to rapidly scaling transistor feature sizes that operate at high clock frequencies, the task of designing efficient CDNs is becoming even more difficult, even when using these techniques. For example, use of clock tree balancing alone is increasingly insufficient because clock buffer mismatches due to in-die process variations limit the ability to minimize skew. Also, traditional H-trees are not well-suited to distributing clocks to asymmetric, irregularly shaped clock domains, and even add further complication to the floor planning and layout of integrated circuits. Further, skew reduction techniques for existing H-tree distributions suffer from high power consumption and inefficient use of interconnects. Other approaches perform skew compensation at a source, independently for each leaf. However, these approaches require long and varying lengths of reference lines returning from each leaf to the source, which introduces errors to skew compensation because of a process-dependent delay of each feedback line. In addition, CDN design must often be finalized before the design of the rest of the circuits in the integrated circuit may be completed, because the level of difficulty in designing efficient CDNs increases in the latter stages of design.

Differential signaling is another approach that may be used to distribute clock signals. Although differential signaling is more effective in many ways as compared to a clock tree approach, implementation of this technique requires more real estate to support the relatively complex circuits that are needed to provide differential signaling. Also, careful routing is required to ensure low resistance of the differential signals over long distances, which often consumes valuable routing resources as higher layers are often used to achieve this requirement. Still another consideration is that the differential signaling circuits require shielding, and provisions that therefor further reduce the desirability of the approach.

As clock distribution for modern integrated circuits becomes more difficult to implement because of increasingly complex systems, decreased power supply voltages, larger die sizes, and higher clock rates, the desirability to be able to overcome the challenges described also becomes more apparent.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of an approach for routing die signals in an interior portion of a die using exterior interconnects are described herein. The approach provides for contacts coupled to circuits in the interior portion of the die, where the contacts are exposed to an exterior portion of the die. The exterior interconnects are configured to couple these contacts so that signals from the circuits in the interior portion of the die may be routed externally to the die. In various aspects of the disclosed approach, the exterior interconnects are protected by a packaging for the die.

In one aspect, the disclosure provides an apparatus including a die including an exterior portion and an interior portion including a plurality of circuits. The plurality of circuits in the interior portion includes a first circuit formed in a first area of the die; and a second circuit formed in a second area of the die. The die further includes first and second die exterior contacts on the exterior portion of the die, wherein the first die exterior contact is electrically connected to the first circuit and the second die exterior contact is electrically connected to the second circuit; and, an interconnect electrically connecting the first and second die exterior contacts and configured to couple the second circuit to the first circuit, wherein the interconnect is located on the exterior portion of the die.

In another aspect, the disclosure provides an apparatus including a die including an exterior portion and an interior portion including a plurality of circuits. The plurality of circuits in the interior portion includes a first circuit formed in a first area of the die; and a second circuit formed in a second area of the die. The die further includes first and second die exterior contact means on the exterior portion of the die, wherein the first die exterior contact means is electrically connected to the first circuit and the second die exterior contact means is electrically connected to the second circuit; and, interconnect means electrically connecting the first and second die exterior contacts and configured to couple the second circuit to the first circuit, wherein the interconnect means is located on the exterior portion of the die.

In yet another aspect, the disclosure provides a semiconductor device that includes a die including an exterior portion and an interior portion including a plurality of circuits. The plurality of circuits in the interior portion includes a first circuit formed in a first area of the die; and a second circuit formed in a second area of the die. The die further includes first and second die exterior contacts on the exterior portion of the die, wherein the first die exterior contact is coupled to the first circuit and the second die exterior contact is coupled to the second circuit; and a package including an interconnect coupled to the first and second die exterior contacts and configured to couple the second circuit to the first circuit, wherein the package is located on the exterior portion of the die.

In still yet another aspect, the disclosure provides a method that includes exposing a plurality of contacts on an exterior portion of a die, wherein the plurality of contacts includes a first contact coupled to a first circuit, and a second contact coupled to a second circuit, wherein the first and second circuits are in an interior portion of the die. The method further includes coupling at least two contacts in the plurality of contacts via at least one interconnect external to the die to connect the first and the second circuits in the interior portion of the die.

These and other aspects of the invention will become more fully understood upon a review of the detailed description, which follows.

BRIEF DESCRIPTION OF THE DRAWINGS

These and other sample aspects of the disclosure will be described in the detailed description that follow, and in the accompanying drawings.

Figure 1:
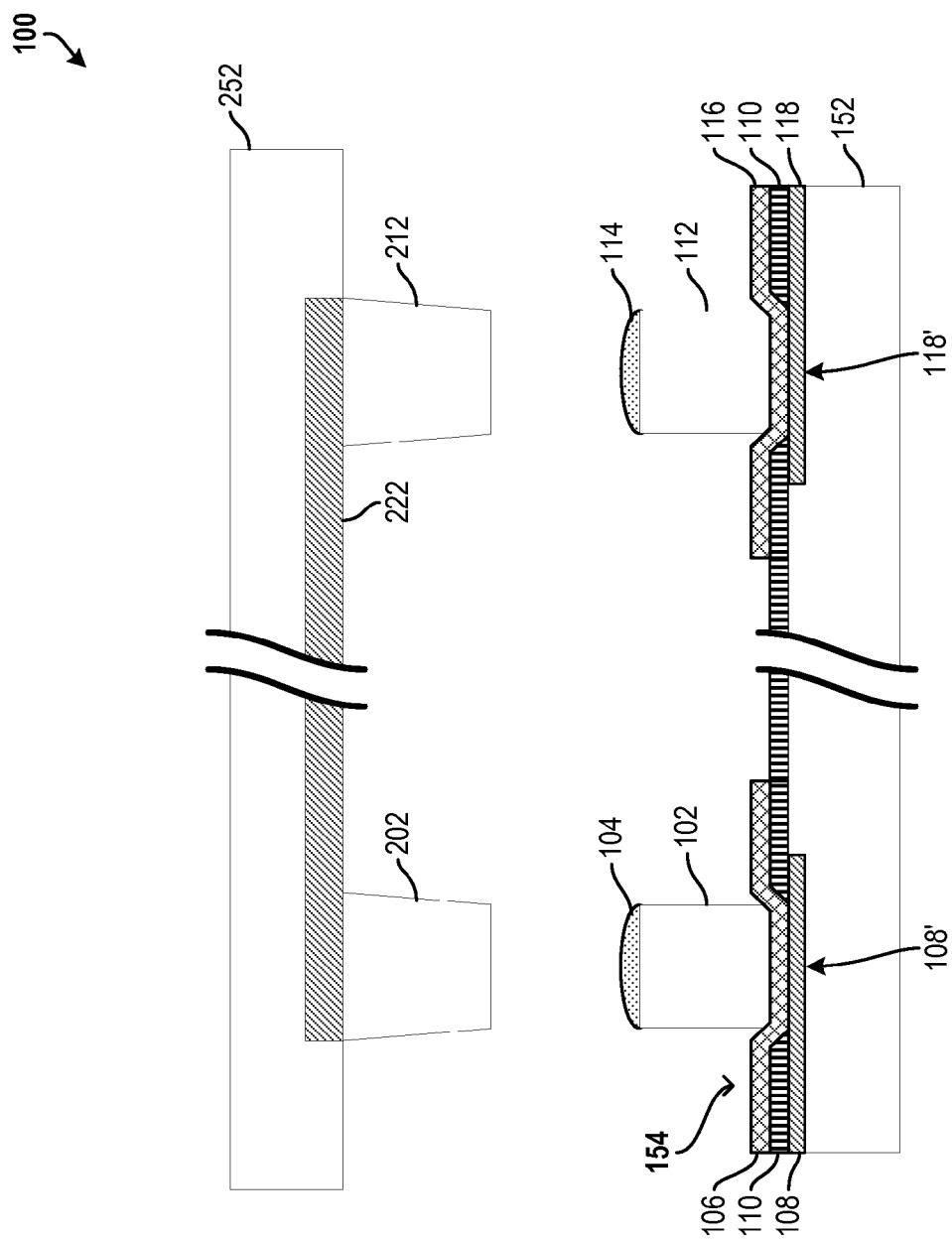
FIG. 1 is an exploded side view of an example of a die signal routing implementation for a semiconductor device assembly configured in accordance with various aspects of the disclosed approach.

In accordance with common practice, some of the drawings may be simplified for clarity. Thus, the drawings may not depict all of the components of a given apparatus (e.g., device) or method, nor be in scale. Finally, like reference numerals may be used to denote like features throughout the specification and figures.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

FIG. 1 illustrates an exploded side view of a semiconductor device assembly 100 that includes a die 152 and a package 252 before they are assembled in a manner as further described herein. Although specific examples may be provided herein for describing the semiconductor device assembly 100 and other illustrated assemblies, it should be noted that various aspects of the disclosed approach may be applied to a variety of integrated circuit packages. Thus, the examples should not be taken as limiting unless otherwise noted. For example, the semiconductor device assembly 100 may be implemented as a single device or as part of a package on package device assembly.

The die 152 may be formed from a silicon wafer in which individual discrete components and one or more circuits are typically etched before the die 152 is cut from the silicon wafer and assembled in the package 252. The package 252 may be a casing made from metal, plastic, glass, and/or ceramic materials to contain and protect the die 152. The package 252 provides protection against impact and corrosion; holds the contact pins or leads that are used to connect external circuits to the die 152; and dissipates heat produced in the die 152. In one aspect of the disclosed approach, the package 252 also includes a conductive routing layer for routing signals that are normally routed within the die 152. However, by extracting these signals from within the die 152 only to reinsert them back into the die 152, this approach to routing signals provides significant flexibility and decreased complexity in layout design; frees valuable die real estate that would otherwise be needed to be set aside for these signals; and increase operational speeds and reliability in the signals routed.

The die 152 includes first and second contact pillars 102, 112 exposed on an exterior surface 154 of the die 152. The first and second contact pillars 102, 112 may be coupled to one or more circuits in an interior portion of the die 152 via respective first and second traces 108, 118. For example, the first trace 108 may be coupled to a clock signal generation circuit that generates a clock signal, and the second trace 118 may be coupled to a clock signal input of a memory circuit or I/O circuit that uses (i.e., consumes) the clock signal. The first contact pillar 102 may be coupled to the output of the clock signal generation circuit while the second contact pillar 112 may be coupled to the clock input of the memory circuit. Although the example used herein may involve distribution of clock signals from a clock circuit to other circuits, various aspects of the disclosed approach may also apply to the distribution of other types of signals and the coupling of other types of circuits in addition to the clock and memory circuits described in the system.

In one aspect of the disclosed approach, a conductive path in the form of an interconnect is provided outside of the die 152 in the package 252 to connect the first contact pillar 102 to the second contact pillar 112 so that signals such as the clock signal from the output of the clock signal generation circuit may be coupled to the clock signal input of the memory circuit. In the implementation illustrated in FIG. 1, the external conductive path is shown as a package routing layer 222 in the package 252. This external conductive path avoids limitations in routing signals in the die 152 because it provides a routing layer separate and apart from the various layers in the die 152.

In one aspect of the disclosed approach, respective electrical connections to the first and second contact pillars 102, 112 by the first and second package routing layer contacts 202, 212 may be made by respective solder caps 104, 114. Thus, in implementation, assembly of the package 252 and the die 152 involves placing the package 252 and the die 152 in close physical proximity to allow electrical connections between the first and second package routing layer contacts 202, 212 and the first and second contact pillars 102, 112 to be made using the solder caps 104, 114. The solder caps 104, 114 may be eutectic solder caps that have been reflowed to form relatively smooth domes that limit solder wicking during assembly, permit the use of less aggressive solder fluxes, and minimize lead content. The solder caps 104, 114 may also be lead-free solder, or indium. In another aspect of the disclosed approach, thermal compression techniques may be used to form the connection between the contact pillar 102 and the package routing layer contact 202. In yet another aspect of the disclosed approach, the connection between the contact pillar 102 and the package routing layer contact 202 may be achieved with conductive adhesives.

Figure 2:
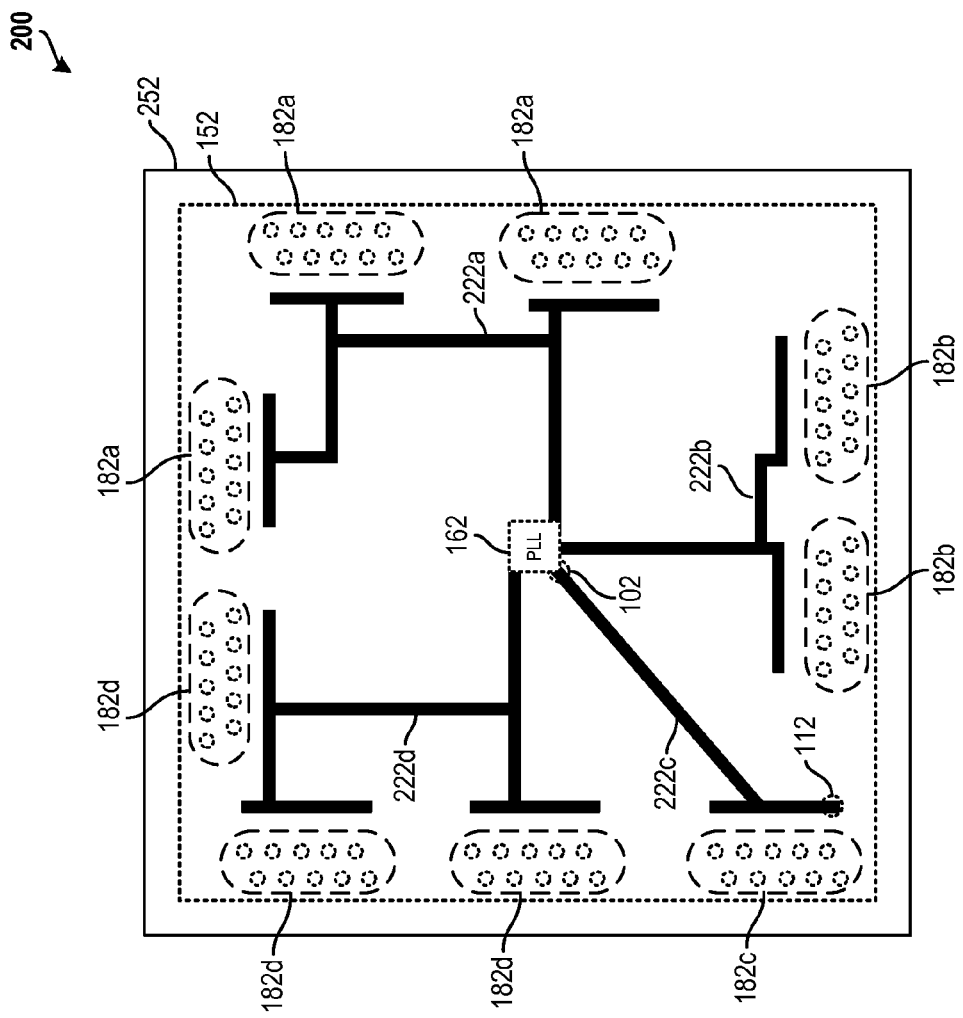
FIG. 2 is a plan view of the die signal routing implementation of FIG. 1.

FIG. 2 illustrates a routing scheme 200 that may be implemented using the package routing layer 222 of FIG. 1 to route a clock signal generated by a phase-lock loop (PLL) circuit 162 in the die 152. The clock signal may be routed via a plurality of routes 222a-d, each of which may be used to couple one or more of a respective plurality of contacts from various other circuits interior to the die 152 to the clock signal. Because FIG. 2 is a combined view of both the die 152 and the package 252, the elements associated with the die 152, including the die 152 itself, will be illustrated using dotted lines to more clearly differentiate between the two. For example, the PLL circuit 162 is represented using a dotted line as the PLL circuit 162 is associated with the die 152.

Further, as FIG. 2 is a plan view and the contact pillars on the die 152 that are connected to the circuits interior to the die that consume the clock signal, such as the second contact pillar 112, would be directly beneath the plurality of routes 222a-d, these contact pillars would normally not be visible in this view. However, an exaggerated representation of the second contact pillar 112 will be used to illustrate that the second contact pillar 112 is beneath at least one of the plurality of routes 222a-d, as further described herein. It should thus be noted that the other contact pillars that are connected to the circuits interior to the die that consume the clock signal, although not visible in the figure because they are covered by respective one of the plurality of routes 222a-d, may be configured in a similar fashion as the second contact pillar 112.

Referring also to FIG. 1, the package routing layer 222 may include the plurality of routes 222a-d, including the route 222c that may be coupled to the second contact pillar 112. Thus, the first contact pillar 102, which may be coupled to the clock signal generated by the PLL circuit 162 through the first trace 108, may pass the clock signal through the route 222c to the second contact pillar 112, which may be coupled to the memory circuit as described by the example in FIG. 1. The memory circuit that is thus coupled to the second contact pillar 112 through the second trace 118 may be able to use the clock signal from the first contact pillar 102.

FIG. 2 also includes a plurality of contacts 182a-d that is not illustrated in FIG. 1, but corresponds to contacts that allow access to circuitry in the die 152. These contacts may be connected to other pins of the package 252 (not shown) and are not electrically coupled to the plurality of routes 222a-d. Thus, the plurality of contacts 182a-d may be contacts used for input/output (I/O), power, or other connections for the die 152. It should be noted that the signals carried by the plurality of contacts 182a-d are different from the signals distributed to other locations in the die 152 using the package routing layer 222 as described above because the latter type of signals remain within the package 252 even though they are routed externally to the die 152. Thus, unlike signals typically conducted from a die through a package to external circuits, the signals distributed using the various aspects disclosed herein are routed externally of the die but remain within the package. As previously noted, the approach of routing these signals externally to the die provides many benefits.

Referring again to FIG. 1, the first and second contact pillars 102, 112 are formed on respective first and second under-bump metallization (UBM) layers 106, 116 that provide mechanical and electrical connection to an exposed pad portion of the first and second traces 108, 118, respectively. Thus, the first UMB layer 106 provides mechanical and electrical connection for the first contact pillar 102 to an exposed pad portion 108' of the first trace 108, and the second UMB layer 116 provides mechanical and electrical connection for the second contact pillar 112 to an exposed pad portion 118' of the second trace 118.

The die 152 includes a passivation layer 110 that, together with the first and second UMB layers 106, 116, provides environmental protection for the die 152. As may be seen in the illustration, the passivation layer 110 overlaps and seals the edges of both the exposed pad portion 108' of the first trace 108 and the exposed pad portion 118' of the second trace 118. The first and second UMB layers 106, 116 seal the openings in the passivation layer 110, thus protecting these pads while providing mechanical and electrical coupling to them, as noted above.

In one aspect of the disclosed approach, the first and second contact pillars 102, 112 may be formed using copper shaped in a cylindrical fashion and may also optionally be electroplated. Example ranges of the parameters associated with the first and second contact pillars 102, 112 include the following parameters:

Pitch: as low as around 60 μm, with current ranges being around 80-110 μm;
Diameter: between 20-50 μm; and
Height: between 15-50 μm, where Pitch is the minimum distance between adjacent contact pillars, as measured from center-to-center; Diameter is the diameter of the contact pillar; and Height is the height of the contact pillar.

Using copper pillars instead of the normally used larger spherical, lead-based solder bumps avoids many undesirable side effects. For example, diameters of the solder bumps are typically as large as 100 μm, which require larger spacing (pitch) between the solder bumps, thereby reducing interconnection density. A longer conductive path through the larger sphere also increases both electrical and thermal resistance of any connection.

The non-melting copper cylinder provides greater die to package distance than solder bumps, thereby providing better stress relief. The high aspect ratio of the copper cylinder may also permit closer spacing (pitch) for a given height, thereby increasing connection density. Often, an electrically-insulating adhesive is underfilled between the die 152 and the package 252 to provide a stronger mechanical connection there between; provide a heat bridge; and to ensure solder joints are not stressed due to differential heating of the die 152 and the rest of the system. Where underfill is used, the greater height may allow faster underfill flow and more uniform distribution. In addition, the greater mechanical shear strength of copper, as compared to lead, both improves the strength of the connections and increases the overall ruggedness of the semiconductor device assembly 100. The increased thermal conductivity of copper compared to lead also improves both the thermal performance of the assembly.

More importantly, the increased electrical conductivity of copper, as compared to lead, and relatively larger size of the first and second contact pillars 102, 112; the first and second package routing layer contacts 202, 212; and the package routing layer 222 minimizes signal loss so even critical signals such as clock signals may be distributed to many different location in the die 152 without significant skew or jitter effects. For example, the package routing layer 222, which be constructed of any suitable conductive material, may be as thick as, or even thicker than, 20 µm. This is significantly thicker as compared to typical values of conductive layers in the die 152, which combined may only amount to around 10 µm. In various aspects of the disclosed approach, there are no limits to the thickness of the package routing layer 122. For example, the thickness of the package routing layer 122 may be 5-times that of the die 152. Further, by being able to separate distribution of the signals routed externally from the die 152, cross-talk from other traces that are normally present may be effectively eliminated.

Figure 3:
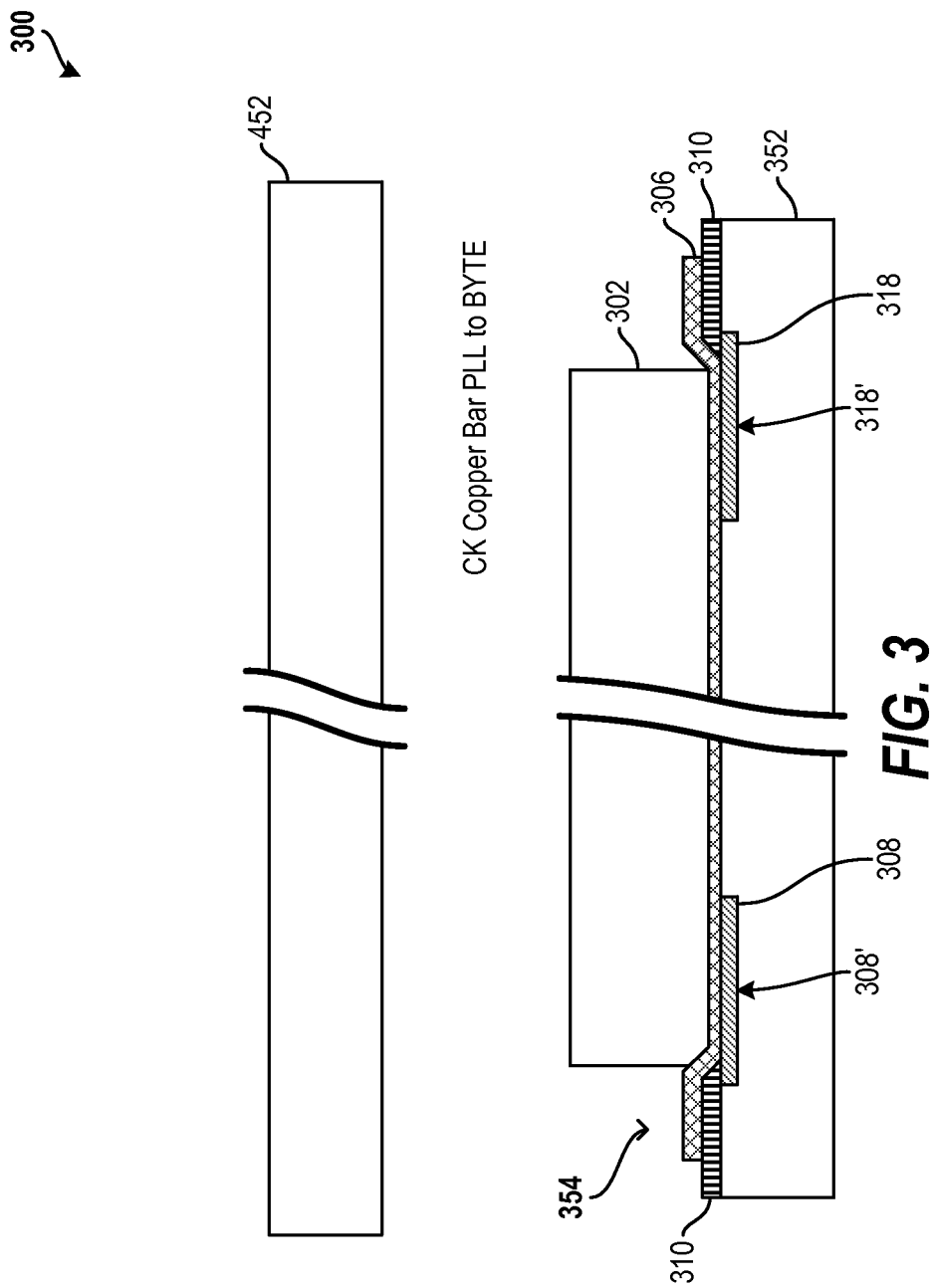
FIG. 3 is an exploded side view of an example of an external die signal routing implementation configured in accordance with various aspects of the disclosed approach.

FIG. 3 illustrates an exploded side view of another semiconductor device assembly 300 that includes a die 352 and a package 452. The die 352 and the package 452 are similar to that as described for the die 152 and the package 252, with differences as noted in the description that follows. In the example shown, instead of contact pillars such as the contact pillars 102, 112 of the semiconductor device assembly 100, a contact bar 302 is exposed on an exterior surface 354 of the die 352 to electrically contact first and second traces 308, 318 through an exposed pad portion 308', 318' of each trace. For example, the first trace 308 may be coupled to a clock signal generation circuit that generates a clock signal, and the second trace 318 may be coupled to a clock signal input of a memory circuit that requires use of (i.e., consumes) the clock signal at the clock signal input. The contact bar 302 may thus couple the output of the clock signal generation circuit with the clock input of the memory circuit.

Figure 4:
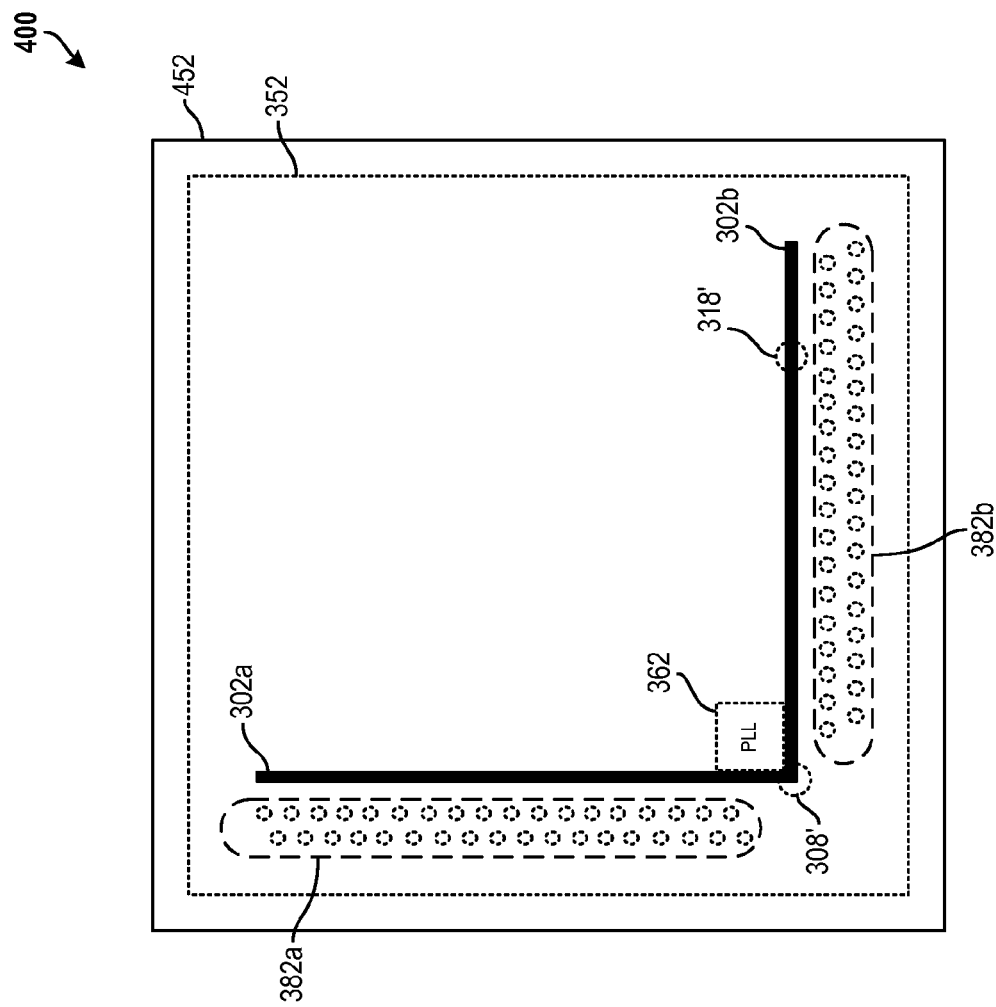
FIG. 4 is a plan view of the external die signal routing implementation of FIG. 3.

FIG. 4 illustrates a routing scheme 400 that may be implemented using the contact bar 302 of FIG. 3 to route a clock signal generated by a phase-lock loop (PLL) circuit 362 in the die 352. The clock signal may be routed via a plurality of contact bars 302a, b, each of which may be used to couple any one of a respective plurality of contacts from various other circuits interior to the die 352 to the clock signal. Because FIG. 4 is a combined view of both the die 352 and the package 452, the elements associated with the die 352, including the die 352 itself, will be illustrated using dotted lines to more clearly differentiate between the two. For example, the PLL circuit 362 is represented using a dotted line as the PLL circuit 362 is associated with the die 352.

Further, as FIG. 4 is a plan view and the exposed pad portions on the die 352 that are connected to the circuits interior to the die that consume the clock signal, such as the exposed pad portion 318' of the second trace 318, would be directly beneath the plurality of contact bars 302a, b, these exposed pad portions would normally not be visible in this view. However, exaggerated representations of the exposed pad portions will be used to illustrate that the exposed pad portion 318' is beneath at least one of the plurality of contact bars 302a, b, as further described herein. It should thus be noted that the other exposed pad portions that are connected to the circuits interior to the die that consume the clock signal, although not visible in the figure because they are covered by respective one of the plurality of contact bars 302a, b, may be configured in a similar fashion as the exposed pad portion 318'.

For example, referring back to FIG. 3, the contact bar 302 may include the plurality of contact bars 302a,b, including the contact bar 302b used to connect to the exposed pad portion 318' of the second trace 318. Thus, the first trace 308, which may be coupled to the clock signal generated by the PLL circuit 362 through the connection of the exposed pad portion 308' of the first trace 308 to the contact bar 302, may have its signal passed through the contact bar 302b to the second trace 318, which may be coupled to the memory circuit as described by the example in FIG. 3 and illustrated as the exposed pad portion 318' underneath the contact bar 302b. The memory circuit that is thus coupled to the second trace 318 may be able to use the clock signal from the first trace 308.

FIG. 4 also includes a plurality of contacts 382a-b that is not illustrated in FIG. 3, but corresponds to contacts that allow access to circuitry in the die 352. These contacts may be connected to other pins and are not electrically coupled to the contact bars 302a, b. Thus, the plurality of contacts 382a-b may be contacts used for input/output (I/O), power, or other connections for the die 352. Again, similar to the discussion for FIG. 2, it should be noted that the signals carried by the plurality of contacts 382a-b are different from the signals distributed to other locations in the die 352 using the contact bar 302 as described above because the latter type of signals remain within the package 452 even though they are routed externally to the die 352. Thus, unlike signals typically conducted from a die through a package to external circuits, the signals distributed using the various aspects disclosed herein are routed externally of the die but remain within the package. As previously noted, the approach of routing these signals externally to the die provides many benefits.

Similar to the die 152, the die 352 includes a passivation layer 310 that, together with a UMB layer 306, provide environmental protection for the die 352. As may be seen in FIG. 3, the passivation layer 310 overlaps and seals the edges of both the exposed pad portion 308' of the first trace 308 and the exposed pad portion 318' of the second trace 318. The UMB layer 306 seal the openings in the passivation layer 306, thus protecting these pads while providing mechanical and electrical coupling to them, as noted above.

In one aspect of the disclosed approach, the contact bar 302 may be formed using a plurality of copper contact pillars and may also optionally be electroplated. Specifically, copper contact pillars similar to the first and second contact pillars 102, 112 of FIG. 1 may be placed sufficiently close to each other so as to form an interconnect. Specifically, as shown in FIG. 3, these copper contact pillars may form a copper "bar." Example ranges of the parameters associated with the contact bar 302 include the following parameters:

Thickness: between 20-50 µm; and
Height: between 20-50 µm, where Thickness is the thickness of the contact bar 302, and may be similar in magnitude to the Diameter range described above; and Height is the height of the contact bar. It should be noted that the contact bar 302 does not necessarily need to be configured in a bar shape, but may be created in other shapes, including non-linear shapes.

Figure 5:
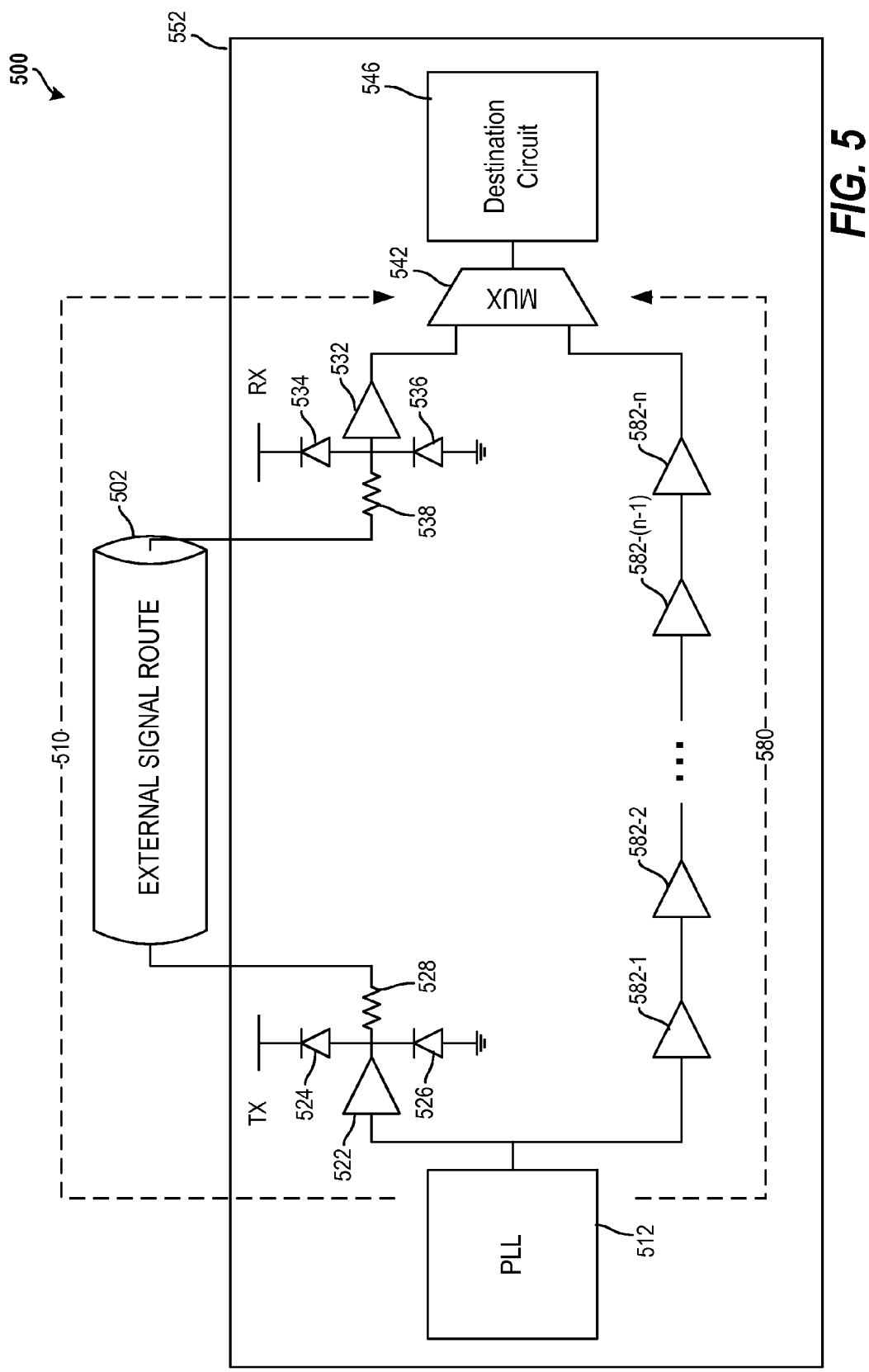
FIG. 5 is a block diagram of a conceptualized die signal routing implementation configured in accordance with various aspects of the disclosed approach.

FIG. 5 illustrates a circuit diagram 500 for describing another aspect of the disclosed approach for externally routing die signals generated by one circuit in a die 552 that are used by other circuits in the die 552. Specifically, the circuit diagram illustrates an approach for testing the die 522. In the example provided, a clock signal provided by a clock signal generation circuit such as a PLL 512 may be transmitted through an external signal route 502 to a destination circuit 546. For example, the destination circuit 546 may be a memory circuit that uses the clock signal from the PLL 512 to operate properly. The external signal route 502 may be one of the approaches described above. For example, the external signal route 502 may be the package routing layer 222 introduced in FIG. 1, or the contact bar 302 introduced in FIG. 3. For the destination circuit 546 to be coupled to the PLL 512 using the external signal route 502, the package in which the package routing layer is located (or the contact bars that are formed on the die) may need to be coupled to the die 552. However, this requires the die 552 be assembled with the package before it is tested if the package routing approach is used; or the die 552 be processed to include connector bars if the connector bar routing approach is used, which wastes assembly/processing resources if it is ultimately determined that the die 522 is defective.

In one aspect of the disclosed approach, a secondary signal path 580, separate from a primary signal path 510 may be provided to allow testing of the die 522 before assembly in a package. For example, the secondary signal path 580 may be a second clock path used to test the die 522 before the die 522 is integrated with a package or further processed to add the external signal route 502. The secondary signal path 580 includes a plurality of repeaters 582-1-n, which may be operated at clock frequencies sufficient to test the die 522, but not necessarily at full operational clock frequencies. Both the primary signal path 510 and the secondary signal path 580 may be coupled to a multiplexer (MUX) 542. The MUX 542 may selectively pass through the appropriate signal based on whether the die 522 is under test (secondary signal path 580) or under a normal operational mode (primary signal path 510). In one aspect of the disclosed approach, the MUX 542 may be controlled either programmatically or through automated testing equipment vectors.

With regard to the external signal route 502, the die 552 includes a transmitter that includes a repeater 522 as well as a pair of diodes 524, 526 and resistive element 528 to transmit signals to a receiver that includes a resistive element 538 coupled to a pair of diodes 534, 536 and a repeater 532. These elements may be used to provide electrostatic discharge protection to the die 552 and may be optional as they are not directly related to providing the functionality of the clock signal.

Figure 6:
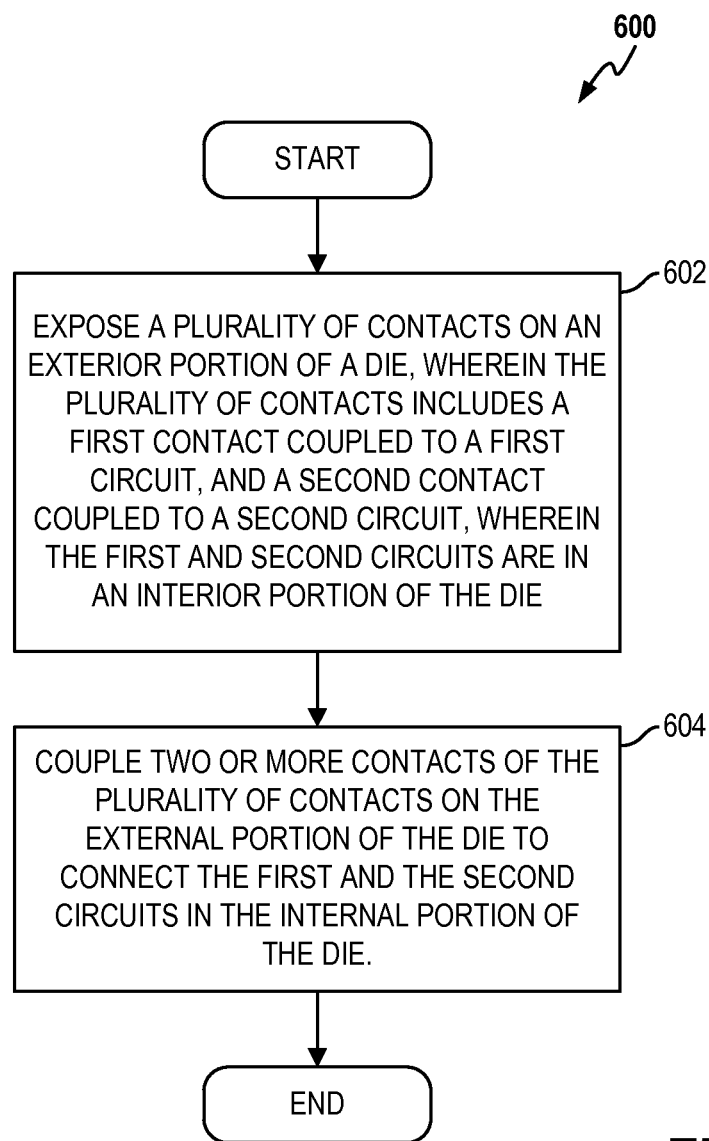
FIG. 6 is a flow diagram of a conceptualized die signal routing implementation configured in accordance with various aspects of the disclosed approach.

FIG. 6 illustrates a process 600 for configuring a die such as the die 152 for routing die signals using external interconnects where, at 602, a plurality of contacts are exposed on an exterior portion of a die, wherein the plurality of contacts includes a first contact coupled to a first circuit, and a second contact coupled to a second circuit, wherein the first and second circuits are in an interior portion of the die. Thus, a plurality of contacts such as the first and second contact pillars 102,112, are exposed on an external portion of the die such as the external surface 154 of the die 152. The plurality of contacts may be formed in accordance with various aspects of the disclosed approach, as discussed above, and may be coupled to circuits in an interior portion of the die.

At 604, at least two contacts in the plurality of contacts are coupled via at least one interconnect external to the die to connect the first and the second circuits in the exterior portion of the die. Thus, two or more contacts in the plurality of contacts on the exterior portion of the die may be coupled using an interconnect such as the package routing layer 222 in the package 252 for coupling the first and second contact pillars 102,112. In one aspect of the disclosed approach, the interconnect may be located in a device package such as the package 252. In another aspect of the disclosed approach, the interconnect may be a conductor such as the contact bar 302 of the die 352 that is formed on the exterior portion of the die, such as the exterior surface 354 of the die 352.

Various aspects of the disclosed approach provide flexibility in configuring the routing as well as avoid such issues as space and interference issues if the signals had to be routed internally in the die. For example, use of external interconnects allows routing of signals normally routed internally to the die, such as clock signals, to be routed outside the die.

For purposes of simplifying the description of the various aspects of the disclosed approach, certain elements and layers such as semiconductor, additional passivation and metal layers have not been shown. Further, common materials that may be used in the construction of the various illustrated assemblies are not described as they should be known to those of ordinary skill in the art.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

Figure 7:
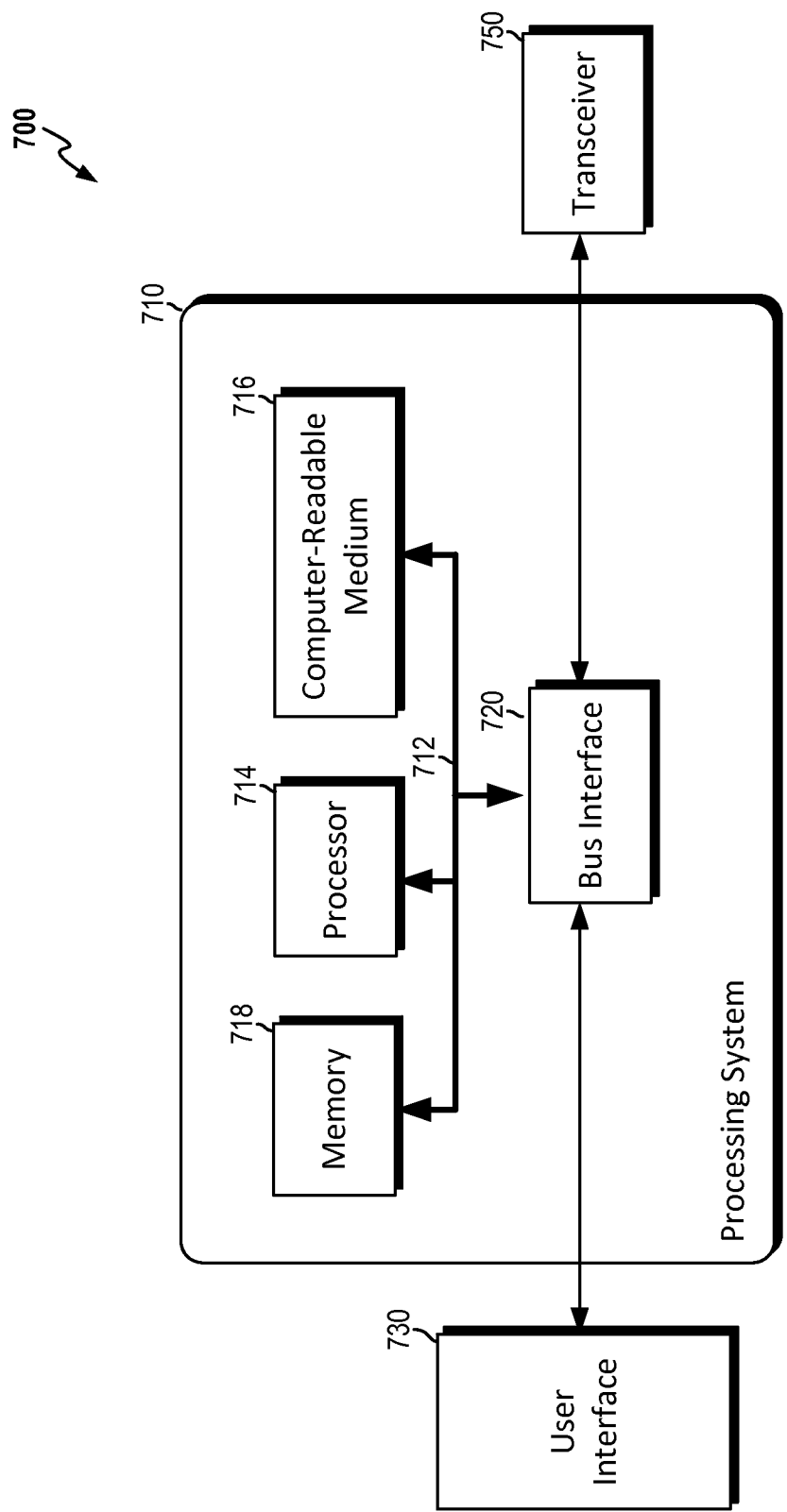
FIG. 7 is a block diagram illustrating an example of a hardware implementation for an apparatus employing a processing system that may utilize the die signal routing implementations described in accordance with various aspects of the disclosed approach.

FIG. 7 is a conceptual diagram illustrating an example of a hardware implementation for an apparatus 700 employing a processing system 710 that may utilize various aspects of the disclosed approach for external signal routing of die signals in a semiconductor device. Thus, in accordance with various aspects of the disclosure, an element, or any portion of an element, or any combination of elements in the apparatus 700 that may be used to implement any device, including a wireless node, may utilize the external die routing approach described herein. The description contained herein of the apparatus 700 is meant to provide a non-limiting example of how various aspects of the disclosed approach may be used to benefit a variety of devices.

For example, the processing system 710 includes one or more processors illustrated as a processor 714. Examples of processors 714 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. Processors such as the processor 714 typically include various subsystems formed on a die, where these various subsystems are dependent on a common clock signal that needs to be distributed throughout various portions of the die. In accordance with various aspects of the disclosed approach, the clock signal may be distributed externally to the die in a package using at least one interconnect external to the die. The external routing may reduce clock skew and phase offsets of the clock signal that is being distributed in the processor 714 as well as increase available space in the interior portion of the die. In addition to the processor 714 of the processing system 710, it should be noted that any integrated circuit in the apparatus 700 may utilize the external routing techniques in an advantageous manner.

The processing system 710 may be implemented as having a bus architecture, represented generally by a bus 712. The bus 712 may include any number of interconnecting buses and bridges depending on the specific application of the processing system 710 and overall design constraints. The bus 712 links together various circuits including one or more processors (represented generally by the processor 714), a memory 718, and computer-readable media (represented generally by a computer-readable medium 716). The bus 712 may also link various other circuits such as timing sources, peripherals, voltage regulators, and power management circuits, which are well known in the art, and therefore, will not be described any further. A bus interface 720 provides an interface between the bus 712 and a transceiver 750. The transceiver 750 provides a means for communicating with various other apparatus over a transmission medium. Depending upon the nature of the apparatus, a user interface 730 (e.g., keypad, display, speaker, microphone, joystick) may also be provided.

The processor 714 is responsible for managing the bus 712 and general processing, including execution of software that may be stored on the computer-readable medium 716 or the memory 718. The software, when executed by the processor 714, causes the processing system 710 to perform the various functions described herein for any particular apparatus. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The computer-readable medium 716 or the memory 718 may also be used for storing data that is manipulated by the processor 714 when executing software. The computer-readable medium 716 may be a non-transitory computer-readable medium such as a computer-readable storage medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. Although illustrated as residing in the processing system 710, the computer-readable medium 716 may reside externally to the processing system 710, or distributed across multiple entities including the processing system 710. The computer-readable medium 716 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus comprising:
   a die comprising an interior portion and an exterior portion, wherein the interior portion comprises:
      a first circuit formed in a first area of the interior portion;
      a second circuit formed in a second area of the interior portion; and
      a third circuit formed in a third area of the interior portion, the first circuit separate from the second circuit or the third circuit; and
   wherein the exterior portion comprises:
      a first trace coupling the first circuit to a first conductive structure supported by the exterior portion of the die;
      a second trace coupling the second circuit to a second conductive structure supported by the exterior portion of the die; and
      a third trace coupling the third circuit to a third conductive structure supported by the exterior portion of the die; and
   a package encasing the die and supporting, via an internal surface of the package, an interconnect layer that is external to the die, the interconnect layer electrically connecting the first, second, and third conductive structures effective to distribute signals generated by the first circuit to the second and third circuits, the signals generated by the first circuit remaining within the package encasing the die.

2. The apparatus of claim 1, wherein the interconnect layer comprises copper or aluminum.

3. The apparatus of claim 1, wherein the interconnect layer is configured to support respective contacts that facilitate the electrical connection of the interconnect layer with the first and second conductive structures.

4. The apparatus of claim 3, wherein the conductive structures comprise copper pillars or copper cylinders.

5. The apparatus of claim 1, wherein the first trace or the second trace of the die comprises a first thickness, the interconnect layer comprises a second thickness, and the second thickness of the interconnect layer is at least 5 times thicker than the first thickness of the first trace or the second trace of the die.

6. The apparatus of claim 1, wherein the interconnect layer is supported by an interior surface of the package.

7. The apparatus of claim 6, wherein the interconnect layer comprises a layer of conductive material formed on the interior surface of the package.

8. The apparatus of claim 6, wherein the signals generated by the first circuit are distributed to the second circuit and remain between the die and the interior surface of the package.

9. The apparatus of claim 6, wherein the signals generated by the first circuit are distributed to the second circuit and remain within the package completely covering the die.

10. The apparatus of claim 1, wherein the first trace and the second trace reside on a routing layer of the die.

11. The apparatus of claim 1, wherein the first circuit is configured to generate a signal and the second circuit is configured to consume the signal.

12. The apparatus of claim 11, wherein the signal is a clock signal and the first circuit comprises a clock circuit or a clock generator configured to generate the clock signal.

13. The apparatus of claim 1, wherein the interior portion of the die further comprises a testing circuit configured to couple the first and second circuits during a testing mode.

14. The apparatus of claim 13, wherein the testing circuit comprises a multiplexer configured to allow selection between the testing circuit and the interconnect layer to couple the first and second circuits.

15. The apparatus of claim 13, wherein the testing circuit that couples the first and second circuits operates at a frequency less than that of signals communicated by the interconnect layer.

16. The apparatus of claim 13, wherein the testing circuit is inoperable to couple the first circuit to the second circuit other than during the testing mode.

17. An apparatus comprising:
   a die comprising an interior portion and an exterior portion, wherein the interior portion comprises:
      a first circuit formed in a first area of the interior portion;
      a second circuit formed in a second area of the interior portion, the first circuit separate from the second circuit; and a third circuit formed in a third area of the interior portion, the first circuit separate from the second circuit or the third circuit;

first and second contact means supported by the exterior portion of the die;

a first trace coupling the first circuit to the first contact means supported by the exterior portion of the die;

a second trace coupling the second circuit to the second contact means supported by the exterior portion of the die;

a third trace coupling the third circuit to a third conductive structure supported by the exterior portion of the die; and a casing that contains the die and supporting contact pins and interconnect means for electrically connecting the first and second contact means effective to couple the first circuit and the second circuit of the interior portion of the die, the contact pins configured to connect signals of the die to circuits external to both the die and the casing.

18. The apparatus of claim 17, wherein the interconnect means comprises copper or aluminum.

19. The apparatus of claim 17, wherein the interconnect means comprises an interconnection layer having respective electrical contacts that facilitate the electrical connection of the interconnect means with the first and second contact means of the die.

20. The apparatus of claim 17, wherein the first and second contact means are formed as metallic pillars or cylinders.

21. The apparatus of claim 17, wherein the first trace or the second trace of the die comprises a first thickness, the interconnect means comprises a second thickness, and the second thickness of the interconnect means is at least 5 times thicker than the first thickness of the first trace or the second trace of the die.

22. The apparatus of claim 17, wherein the interconnect means comprises a layer of conductive material formed on an interior surface of the casing.

23. The apparatus of claim 17, wherein signals generated by the first circuit are distributed to the second circuit and remain between the die and an interior surface of the casing completely covering the die.

24. The apparatus of claim 17, wherein signals generated by the first circuit are distributed to the second circuit and remain within the casing completely covering the die.

25. The apparatus of claim 17, wherein at least one of the first and second contact means comprise a copper pillar supported by an under-bump metallization layer of the die.

26. The apparatus of claim 17, wherein the first trace and the second trace reside on a routing layer of the die.

27. The apparatus of claim 17, wherein the first circuit comprises means for generating a signal and the second circuit is configured to consume the signal.

28. The apparatus of claim 17, wherein the interior portion of the die further comprises testing means configured to couple the first and second circuits during a testing mode.

29. The apparatus of claim 28, wherein the testing means comprises a multiplexer configured to allow selection between a testing circuit and the interconnect means to couple the first and second circuits.

30. The apparatus of claim 28, wherein the testing means that couples the first and second circuits operates at a frequency less than that of signals communicated by the interconnect means.

31. The apparatus of claim 28, wherein the testing means is inoperable to couple the first circuit to the second circuit other than during the testing mode.

\* \* \* \* \*